United States Patent
Chang et al.

(10) Patent No.: US 9,716,036 B2
(45) Date of Patent: Jul. 25, 2017

(54) ELECTRONIC DEVICE INCLUDING MOAT POWER METALLIZATION IN TRENCH

(71) Applicant: GLOBALFOUNDRIES INC., Grand Cayman (KY)

(72) Inventors: Josephine B. Chang, Mahopac, NY (US); Leland Chang, New York, NY (US); Michael A. Guillorn, Yorktown Heights, NY (US); Chung-Hsun Lin, White Plains, NY (US); Adam M. Pyzyna, Courtlandt Manor, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 22 days.

(21) Appl. No.: 14/733,398

(22) Filed: Jun. 8, 2015

(65) Prior Publication Data

US 2016/0358852 A1    Dec. 8, 2016

(51) Int. Cl.
*H01L 23/48*   (2006.01)
*H01L 21/768*  (2006.01)
*H01L 23/528*  (2006.01)
*H01L 27/12*   (2006.01)

(52) U.S. Cl.
CPC .... *H01L 21/76879* (2013.01); *H01L 23/5286* (2013.01); *H01L 27/1203* (2013.01)

(58) Field of Classification Search
CPC ..................... H01L 21/76879; H01L 23/5226
USPC ....... 257/207, 208, 211, 347, 685, 691, 723, 257/773
See application file for complete search history.

(56) References Cited

U.S. PATENT DOCUMENTS

| | | | |
|---|---|---|---|
| 6,121,659 | A  | 9/2000  | Christensen |
| 6,140,674 | A  | 10/2000 | Hause |
| 6,479,974 | B2 | 11/2002 | Cohn |
| 6,492,244 | B1 | 12/2002 | Christensen |
| 6,498,057 | B1 | 12/2002 | Christensen |
| 6,667,518 | B2 | 12/2003 | Christensen |
| 6,964,897 | B2 | 11/2005 | Bard |
| 7,951,666 | B2 | 5/2011  | Ho |
| 8,063,415 | B2 | 11/2011 | Tsuda |

(Continued)

OTHER PUBLICATIONS

A. Mallik et al., "TEASE: a systematic analysis framework for early evaluation of FinFET-based advanced technology nodes." Proceedings of the 50th Annual Design Automation Conference, 2013, 6 pages.

(Continued)

*Primary Examiner* — Hung Vu
(74) *Attorney, Agent, or Firm* — Yuanmin Cai; Hoffman Warnick LLC (57) ABSTRACT

An electronic device is provided. The electronic device includes a semiconductor layer, a dielectric layer disposed on the semiconductor layer, circuitry disposed on the dielectric layer that includes interconnected cells, first contact line metallization and second contact line metallization, first power metallization disposed in-plane with or above the circuitry and second power metallization disposed in a trench defined in at least the dielectric layer. The electronic device further includes insulation disposed to insulate the second power metallization from the circuitry and the first power metallization at first locations and to permit electrical communication between the second power metallization, the circuitry and the first power metallization at second locations.

16 Claims, 5 Drawing Sheets

(56) References Cited

U.S. PATENT DOCUMENTS

| | | |
|---|---|---|
| 8,437,166 B1 | 5/2013 | Huang |
| 8,536,018 B1 | 9/2013 | Anderson |
| 8,736,353 B2 | 5/2014 | Bernstein |
| 8,816,470 B2 | 8/2014 | Erickson |
| 2002/0047158 A1* | 4/2002 | Park ............... H01L 29/78612 257/347 |
| 2009/0085217 A1* | 4/2009 | Knickerbocker ..... H01L 21/486 257/774 |
| 2009/0269897 A1 | 10/2009 | Anderson |
| 2014/0246791 A1 | 9/2014 | Stephens |
| 2014/0252629 A1 | 9/2014 | Chang |
| 2014/0252630 A1 | 9/2014 | Chang |

OTHER PUBLICATIONS

K. Vaidyanathan et al., "Design and manufacturability tradeoffs in unidirectional and bidirectional standard cell layouts in 14 nm node," Proc. of SPIE, vol. 8327, 2012, 83270K, 12 pages.

\* cited by examiner

ELECTRONIC DEVICE INCLUDING MOAT POWER METALLIZATION IN TRENCH

BACKGROUND

The present invention relates to electronic devices and, more specifically, to electronic devices including moat power metallization in trenches and methods of forming electronic devices including moat power metallization in trenches.

In conventional electronic devices, electronic device cells may be arranged in a matrix-like formation (e.g., a N×2 cell formation) in which each cell is separated from its neighboring cells and a power rail is provided on either side of the cell formation. This leads to redundant via and metallization on power rails, such as contact-to-gate (CB) line metallization that extends along an entirety of the electronic device and a bi-directional M1 metallization layer. Signal routing between cells can thus be limited and metallization connections are often required to be made at M3 (or higher) metallization layers.

SUMMARY

According to one embodiment of the present invention, an electronic device is provided. The electronic device includes a semiconductor layer, a dielectric layer disposed on the semiconductor layer, circuitry disposed on the dielectric layer that includes interconnected cells, first contact line metallization and second contact line metallization, first power metallization disposed in-plane with or above the circuitry and second power metallization disposed in a trench defined in at least the dielectric layer. The electronic device further includes insulation disposed to insulate the second power metallization from the circuitry and the first power metallization at first locations and to permit electrical communication between the second power metallization, the circuitry and the first power metallization at second locations.

According to another embodiment, an electronic device is provided and includes a silicon-on-insulator (SOI) substrate formed to define first and second trenches, circuitry formed in an uppermost portion of the SOI substrate between the first and second trenches, first power metallization disposed in-plane with or above the circuitry, second power metallization disposed in the first and second trenches and insulation disposed to insulate the second power metallization from the circuitry and the first power metallization at first locations and to permit electrical communication between the second power metallization, the circuitry and the first power metallization at second locations.

According to yet another embodiment, a method of forming an electronic device is provided and includes forming a silicon-on-insulator (SOI) substrate, defining first and second trenches in the SOI substrate, patterning circuitry in an uppermost portion of the SOI substrate, disposing at least first and second power metallization in-plane with or above the patterned circuitry and in the first and second trenches, respectively and depositing insulation to insulate the second power metallization from the circuitry and the first power metallization at first locations and to permit electrical communication between the second power metallization, the circuitry and the first power metallization at second locations.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

As will be described below, an electronic device is provided that uses a moat capacitor as a power rail. Top trench oxide (TTO) on the moat would enable source and drain contact (CA) lines and contact-to-gate (CB) lines to run over the top of the power rail without making electrical contact with the power rail itself. Such a configuration will thus provide for local cell routing, routing between two cells not on a linear track without using upper layer (M3) metallization, CA/CB connections to the power rail and enablement of a CB line to be used for local signal routing above the power rail. The moat power rail can also be used as a decoupling capacitor as well as a low resistance power line.

Figure 1:
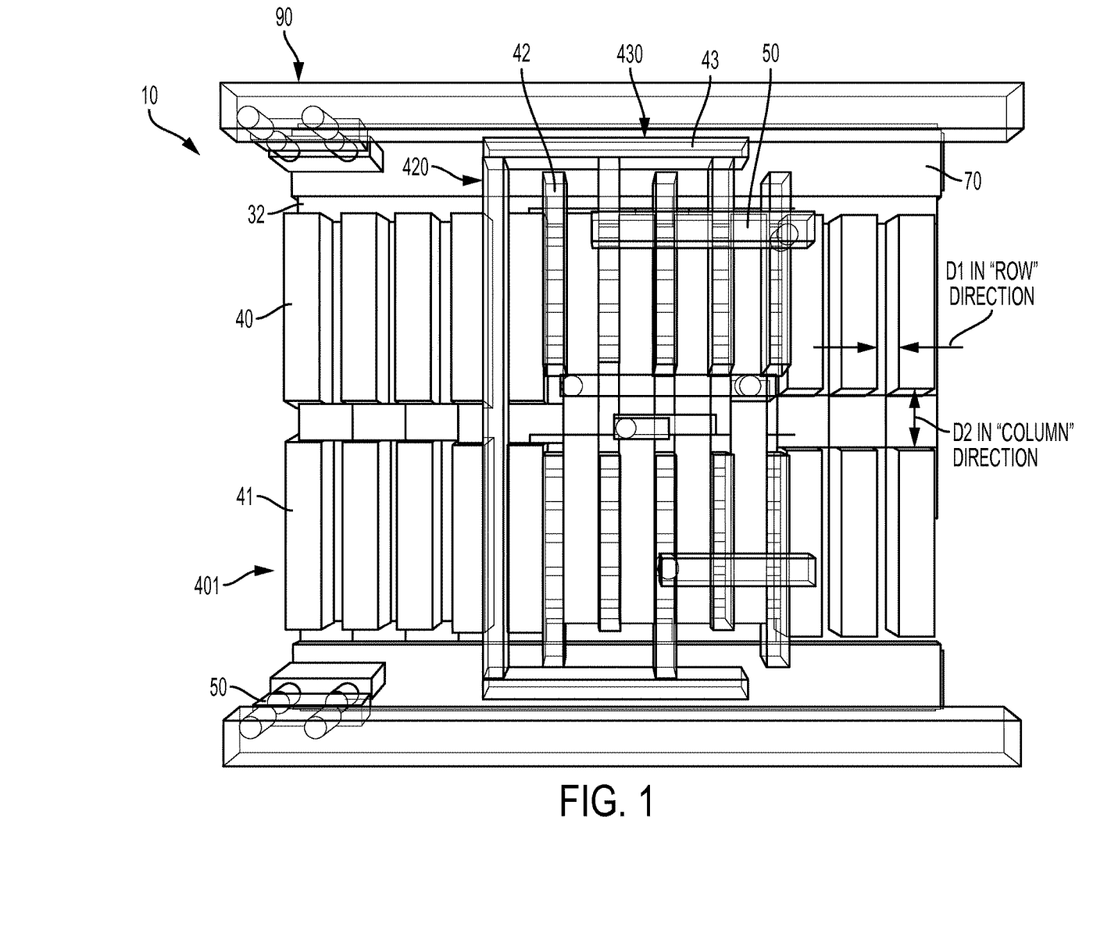
FIG. 1 is a top-down view of an electronic device in accordance with embodiments.
Figure 2A:
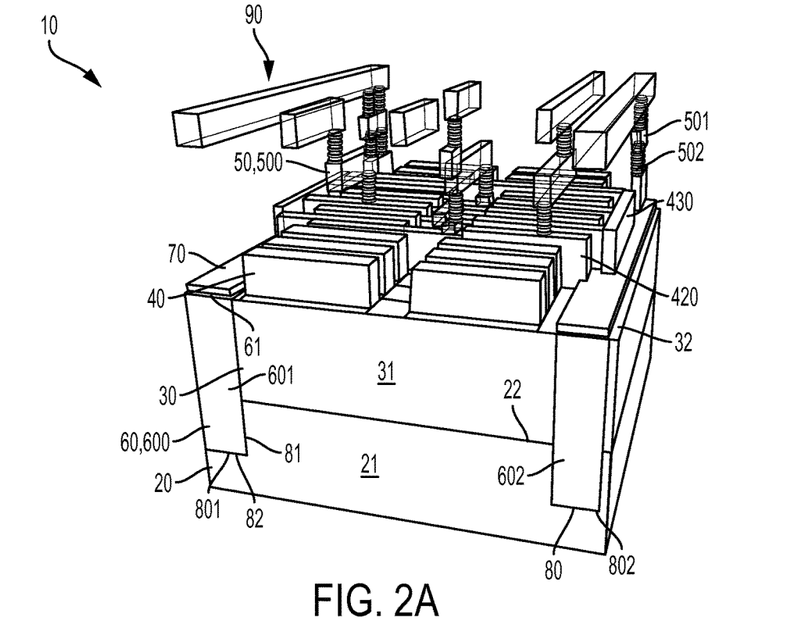
FIG. 2A is a perspective view of the electronic device of FIG. 1.
Figure 2B:
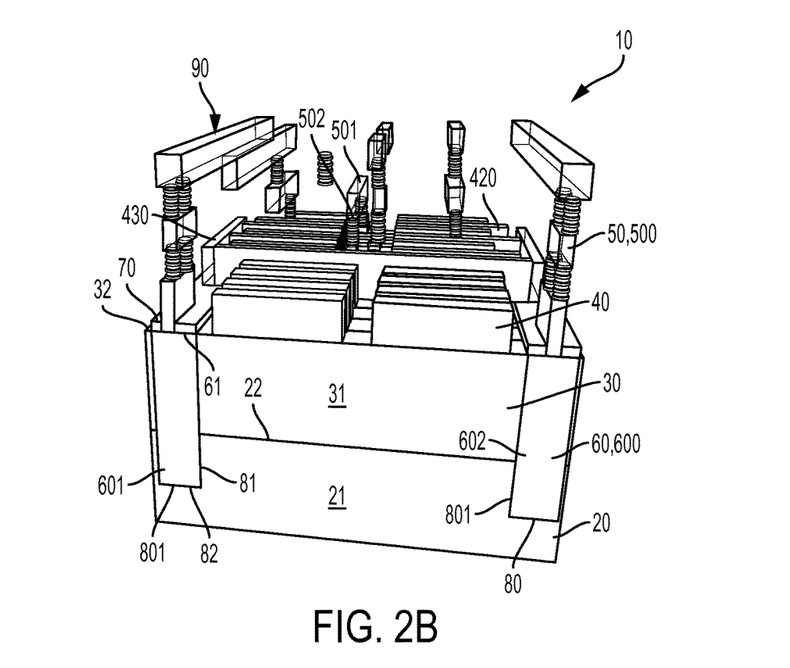
FIG. 2B is a perspective view of the electronic device of FIG. 1 from an opposite direction as that of FIG. 2A.

With reference now to FIGS. 1, 2A and 2B, an electronic device 10 is provided and includes a semiconductor layer or bulk substrate 20 having a body 21 and an upper surface 22, a dielectric layer 30 and circuitry 40. The dielectric layer 30 has a body 31 that is disposed on the upper surface 22 of the semiconductor layer 20 and an upper surface 32. The circuitry 40 is patterned from an initial silicon-on-insulator (SOI) substrate structure and is disposed on the upper surface 32 of the dielectric layer 30. In accordance with embodiments, the semiconductor layer 20 may be formed of silicon or other similar semiconductor materials and the dielectric layer 30 may be formed of buried oxide (BOX). The circuitry 40 includes an interconnected arrangement of cells 401, such as patterned front-end elements (e.g., fins, gates, etc.) 41, first contact line metallization 42 and second contact line metallization 43.

The first contact line metallization 42 may be formed as source and drain contact (CA) line metallization 420. The second contact line metallization 43 may be formed as contact-to-gate (CB) line metallization 430.

Figure 5A:
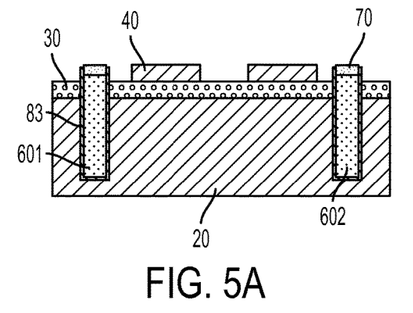
FIG. 5A is an axial view illustrating a first intermediate stage of electronic device formation in accordance with embodiments.
Figure 5B:
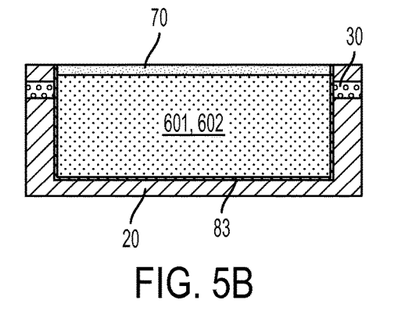
FIG. 5B is an axial view illustrating the first intermediate stage of the electronic device formation of FIG. 5A.
Figure 6A:
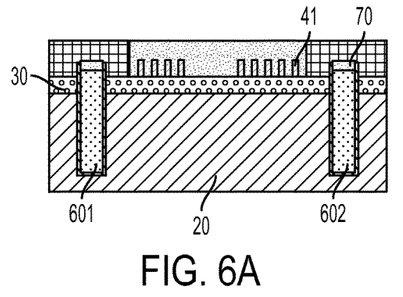
FIG. 6A is an axial view illustrating a second intermediate stage of electronic device formation in accordance with embodiments.
Figure 6B:
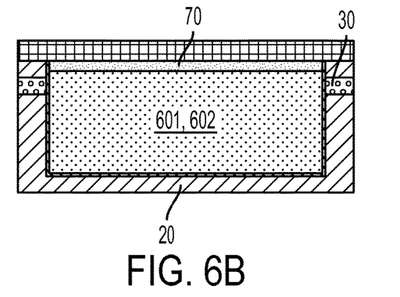
FIG. 6B is an axial view illustrating the second intermediate stage of the electronic device formation of FIG. 6A.
Figure 7A:
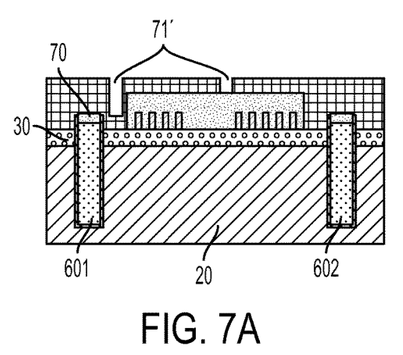
FIG. 7A is an axial view illustrating a third intermediate stage of electronic device formation in accordance with embodiments.
Figure 7B:
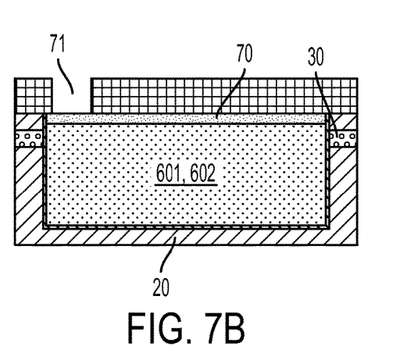
FIG. 7B is an axial view illustrating the third intermediate stage of the electronic device formation of FIG. 7A.
Figure 8A:
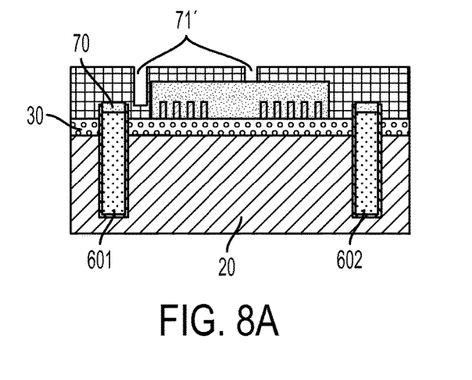
FIG. 8A is an axial view illustrating a fourth intermediate stage of electronic device formation in accordance with embodiments.
Figure 8B:
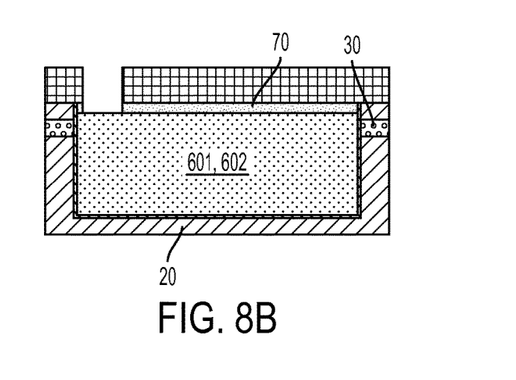
FIG. 8B is an axial view illustrating the fourth intermediate stage of the electronic device formation of FIG. 8A.
Figure 9A:
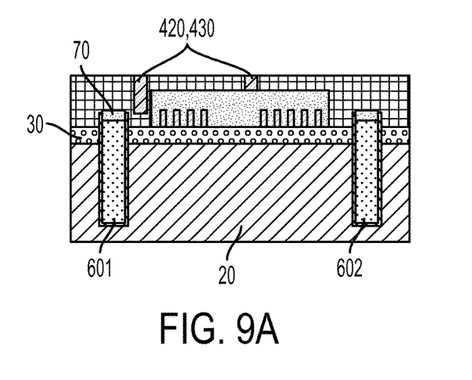
FIG. 9A is an axial view illustrating a fifth intermediate stage of electronic device formation in accordance with embodiments.
Figure 9B:
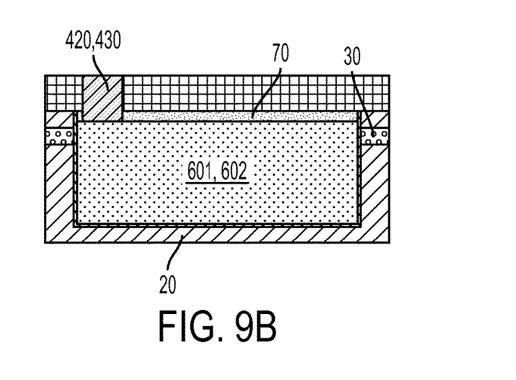
FIG. 9B is an axial view illustrating the fifth intermediate stage of the electronic device formation of FIG. 9A.

The electronic device 10 further includes first power metallization 50, second power metallization 60 and insulation 70. The first power metallization 50 may be provided as M1 power metallization 500 and is disposed in-plane with or above the plane of the circuitry 40. The second power metallization 60 may be provided as a moat power rail 600 and is disposed in a trench 80. The trench 80 is defined in at least the dielectric layer 30 and may extend into the semiconductor layer 20. The trench 80 includes sidewalls 81 and a lower wall 82 both of which may be coated with insulation 83 (see FIGS. 5A and 5B) that insulates the moat power rail 600 from the dielectric layer 30 and, where applicable, the semiconductor layer 20 (see, e.g., FIGS. 5A and 5B).

The second power metallization 60 has an upper surface 61. The insulation 70 may be formed of a dielectric material, such as a top trench oxide (TTO), and is disposed on at least the upper surface 61 and is formed to define vias 71 (see FIG. 3) therein. The insulation 70 is thus configured to insulate the second power metallization 60 from the circuitry 40 and the first power metallization 50 at first locations, which are defined as being remote from the vias 71, and to permit electrical communication between the second power metallization 60 and the circuitry 40 and between the second power metallization 60 and the first power metallization 50 at second locations. The second locations are defined as the locations of the vias 71.

As noted above, in conventional electronic devices, the cells are arranged in a matrix-like formation (e.g., a N×2 cell formation) in which each cell is separated from its neighboring cells and the power rail is provided as first and second power rails respectively sitting on the upper surface of the dielectric layer on either side of the cell formation. This leads to redundant via and metallization on power rails, such as CB line metallization that extends along an entirety of the electronic device and a bi-directional M1 metallization layer. Signal routing between cells can thus be limited and metallization connections are often required to be made at M3 (or higher) metallization layers. In accordance with embodiments, however, the redundant via and metallization on power rails, the limited signal routing and the M3 or higher metallization connections can be avoided.

For example, in the embodiments of FIGS. 1, 2A and 2B, the cells 401 are arranged in a 5×2 cell formation, a 3×2 cell formation and a 4×1 cell formation. The 4×1 cell formation is axially interposed between the 5×2 and the 3×2 cell formations. The 5×2 and the 3×2 cell formations include relatively short cells separated in the "row" direction by a first distance D1 and in the "column" direction by a second distance D2. The 4×1 cell formation includes relatively long cells separated in the "row" direction by the first distance D1. Here, the moat power rail 600 is provided as first and second moat power rails 601 and 602 that extend along an entirety of the electronic device 10 and respectively sit within first and second trenches 801 and 802, which are defined on either side of the electronic device 10.

Since the first and second moat power rails 601 and 602 sit within the first and second trenches 801 and 802, the space that would otherwise be occupied by the first and second moat power rails 601 and 602 can now be occupied by the CB line metallization 430, which provides for local signal routing that runs in parallel with the first and second power metallization 50 and 60 on an upper surface 72 of the insulation 70. Thus, the CA line metallization 420 can run perpendicular to the first and second power metallization 50 and 60 between the cells 401 in the "column" direction. Moreover, the first power metallization 50 can be provided as uni-directional M1 power metallization 500 including an M1 power rail 501 and a contact via 502. The M1 power rail 501 may be provided as a plurality of M1 power rails 501 that each extend over the insulation 70 or the cells 401 in parallel with only a local portion of the moat power rail 600. That is, while the moat power rail 600 may extend along an entirety of the electronic device 10, the M1 power rails 501 may only extend along a short, local portion of the electronic device 10. The contact via 502 may be provided as multiple contact vias for each M1 power rail 501 and extends downwardly from a lower surface of the corresponding M1 power rail 501.

As shown in FIGS. 1, 2A and 2B, the electronic device 10 may further include additional power metallization 90. Such additional power metallization 90 may be provided as M2, M3, . . . , etc., power metallization and is disposed above and in electrical communication with the circuitry 40 and the first power metallization 50. In accordance with embodiments, a structure of the additional power metallization 90 may be uni-directional and similar to that of the first power metallization 50.

Figure 3:
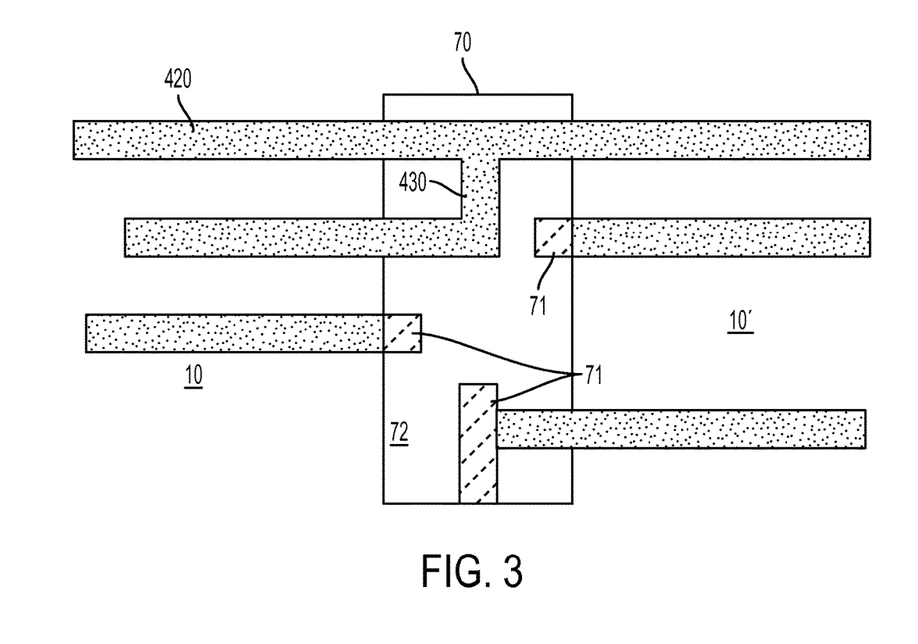
FIG. 3 is a schematic top-down view of an enlarged portion of an electronic device in accordance with embodiments.

With reference to FIG. 3 and, in accordance with further embodiments, the insulation 70 may be about 2.5 times a width of the CA and CB line metallization 420 and 430 although it is to be understood that this is merely exemplary and that the insulation 70 may be narrower or wider. In any case, the insulation 70 may be at least as wide as the CB line metallization 430 so that portions of the CB line metallization 430 can run over and along the insulation 70 in parallel with the moat power rail 600 with some portions of the CB line metallization 430 electrically communicative with the moat power rail by way of the vias 71 at the second locations. In addition, in some cases, portions of the CA line metallization 420 may run partially across the insulation 70 the portions of the CA line metallization 420 can be electrically communicative with the moat power rail 600 by way of the vias 71 at the second locations. In still other cases, portions of the CA line metallization 420 may run entirely across the insulation 70 to, for example, adjacent electronic devices 10'.

Figure 4A:
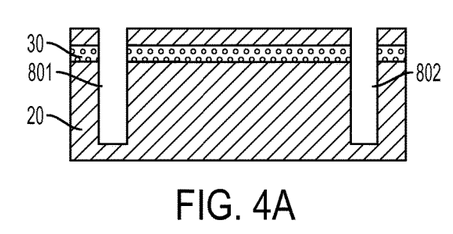
FIG. 4A is an axial view illustrating an initial stage of electronic device formation in accordance with embodiments.
Figure 4B:
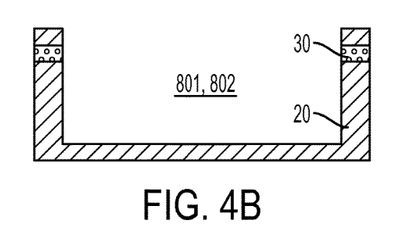
FIG. 4B is an axial view illustrating the initial stage of the electronic device formation of FIG. 4A.

With reference to FIGS. 4A-10B, a method of forming the electronic device 10 of FIGS. 1-3 is provided. As shown in FIGS. 4A and 4B, in an initial stage of electronic device formation, a silicon-on-insulator (SOI) substrate is etched to define the first and second trenches 801 and 802. Then, in a first intermediate stage of the electronic device formation as shown in FIGS. 5A and 5B, the circuitry 40 is patterned in an uppermost portion (i.e., SOI layer) of the SOI substrate while the first and second trenches 801 and 802 are lined with the insulation 83, filled with conductive material (e.g., a metal plug) to form the first and second moat power rails 601 and 602 and topped with a dielectric cap to form the insulation 70.

Figure 10A:
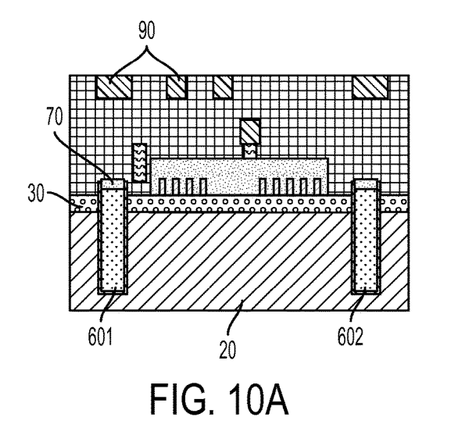
FIG. 10A is an axial view illustrating a late stage of electronic device formation in accordance with embodiments.
Figure 10B:
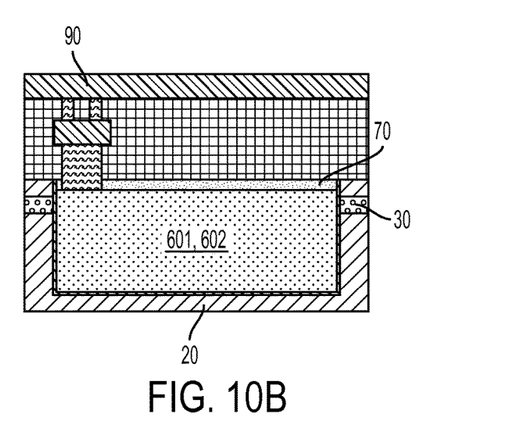
FIG. 10B is an axial view illustrating the late stage of the electronic device formation of FIG. 10A.

As shown in FIGS. 6A-9B, in second through fifth intermediate stages of the electronic device formation, the patterning of the circuitry 40 may further include formation of the front-end elements 41, etching vias 71' for CA and CB line metallization 420 and 430, removing portions of the insulation 70 to form the vias 71 at the second locations and disposing CA and CB metallization 420 and 430 in the etchings. Next, as shown in FIGS. 10A and 10B, in a late stage of the electronic device formation, the first power metallization 50 and the additional power metallization 90 and patterned and formed.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. An electronic device, comprising:
    a semiconductor layer;
    a dielectric layer disposed on the semiconductor layer;
    circuitry disposed on the dielectric layer and comprising interconnected cells, first contact line metallization and second contact line metallization;
    first power metallization disposed in-plane with or above the circuitry;
    second power metallization disposed in a trench defined in at least the dielectric layer; and
    insulation disposed to insulate the second power metallization from the circuitry and the first power metallization at first locations and to permit electrical communication between the second power metallization, the circuitry and the first power metallization at second locations.

2. The electronic device according to claim 1, herein the semiconductor layer comprises a silicon layer and the dielectric layer comprises a buried oxide (BOX) layer.

3. The electronic device according to claim 1, wherein:
    the first contact line metallization comprises source and drain contact (CA) line metallization,
    the second contact line metallization comprises contact-to-gate (CB) line metallization,
    the first power metallization comprises M1 metallization, and
    the second power metallization comprises a moat power rail insulated from trench sidewalls.

4. The electronic device according to claim 3, wherein the cells comprise front-end elements.

5. The electronic device according to claim 3, wherein the first and second power metallization run perpendicular to the CA line metallization and parallel to the CB line metallization.

6. The electronic device according to claim 5, wherein a portion of the CB line metallization runs over the insulation.

7. The electronic device according to claim 5, wherein a portion of the CA line metallization runs partially across the insulation.

8. The electronic device according to claim 5, wherein a portion of the CA line metallization runs entirely across the insulation.

9. The electronic device according to claim 5, wherein the insulation is about 2.5 times a width of the CA and CB line metallization.

10. The electronic device according to claim 5, wherein the M1 metallization comprises:
    an M1 power rail extending in parallel with a portion of the moat power rail; and
    a contact via extending from a lower surface of the M1 power rail.

11. The electronic device according to claim 1, wherein the trench extends into the semiconductor layer.

12. The electronic device according to claim 1, wherein the insulation comprises dielectric material formed to define vias at the second locations.

13. The electronic device according to claim 1, further comprising additional power metallization disposed above and in electrical communication with the circuitry and the first power metallization.

14. An electronic device, comprising:
    a silicon-on-insulator (SOI) substrate formed to define first and second trenches;
    circuitry formed in an uppermost portion of the SOI substrate between the first and second trenches;
    first power metallization disposed in-plane with or above the circuitry;
    second power metallization disposed in the first and second trenches; and
    insulation disposed to insulate the second power metallization from the circuitry and the first power metallization at first locations and to permit electrical communication between the second power metallization, the circuitry and the first power metallization at second locations.

15. The electronic device according to claim 14, further comprising additional power metallization disposed above and in electrical communication with the circuitry and the first power metallization.

16. An electronic device, comprising:
a semiconductor layer;
a dielectric layer disposed on the semiconductor layer;
circuitry disposed on the dielectric layer and comprising:
  interconnected cells;
    first contact line metallization including source and drain contact (CA) line metallization; and
    second contact line metallization including contact-to-gate (CB) line metallization;
first power metallization disposed in-plane with or above the circuitry, the first power metallization including M1 metallization;
second power metallization disposed in a trench defined in at least the dielectric layer, the second power metallization including a moat power rail insulated from trench sidewalls; and
insulation disposed to insulate the second power metallization from the circuitry and the first power metallization at first locations and to permit electrical communication between the second power metallization, the circuitry and the first power metallization at second locations.

* * * * *